Sept. 22, 1970 C. K. SUZUKI ET AL 3,530,011

PROCESS FOR EPITAXIALLY GROWING GERMANIUM ON GALLIUM ARSENIDE

Filed Dec. 7, 1964 2 Sheets-Sheet 1

INVENTORS
CLARENCE K. SUZUKI
ROY H. HARADA

BY L. Lee Humphries

ATTORNEY

PROCESS FOR EPITAXIALLY GROWING GERMANIUM ON GALLIUM ARSENIDE

Filed Dec. 7, 1964 2 Sheets-Sheet 2

INVENTORS
CLARENCE K. SUZUKI
ROY H. HARADA
BY L. Lee Humphries
ATTORNEY

United States Patent Office 3,530,011

Patented Sept. 22, 1970

3,530,011
PROCESS FOR EPITAXIALLY GROWING GERMANIUM ON GALLIUM ARSENIDE

Clarence K. Suzuki and Roy H. Harada, Costa Mesa, Calif., assignors to North American Rockwell Corporation Filed Dec. 7, 1964, Ser. No. 416,219
Int. Cl. H01l 7/34, 7/38
U.S. Cl. 148—1.5 14 Claims

ABSTRACT OF THE DISCLOSURE

A process for epitaxially growing, from a liquid solution, germanium on gallium arsenide. A GaAs substrate and a solution of Ga and Ge are placed in isolated relationship in a container. The solution is heated to a temperature at which an excess of about 0.5 percent germanium exists; the substrate is heated to between 5° and 15° higher than this temperature. The substrate then is immersed in the solution, and as the combination reaches temperature equilibrium a thin layer of the substrate is dissolved into the solution, forming a smooth surface for subsequent deposition. The equilibrium temperature of the substrate and the solution then is lowered gradually to maintain between 0.5% and 5% excess germanium in the solution. The excess germanium percipitates out and grows epitaxially on the substrate. The substrate with its epitaxial germanium layer then is removed from the remainder of the solution.

Figure 1:
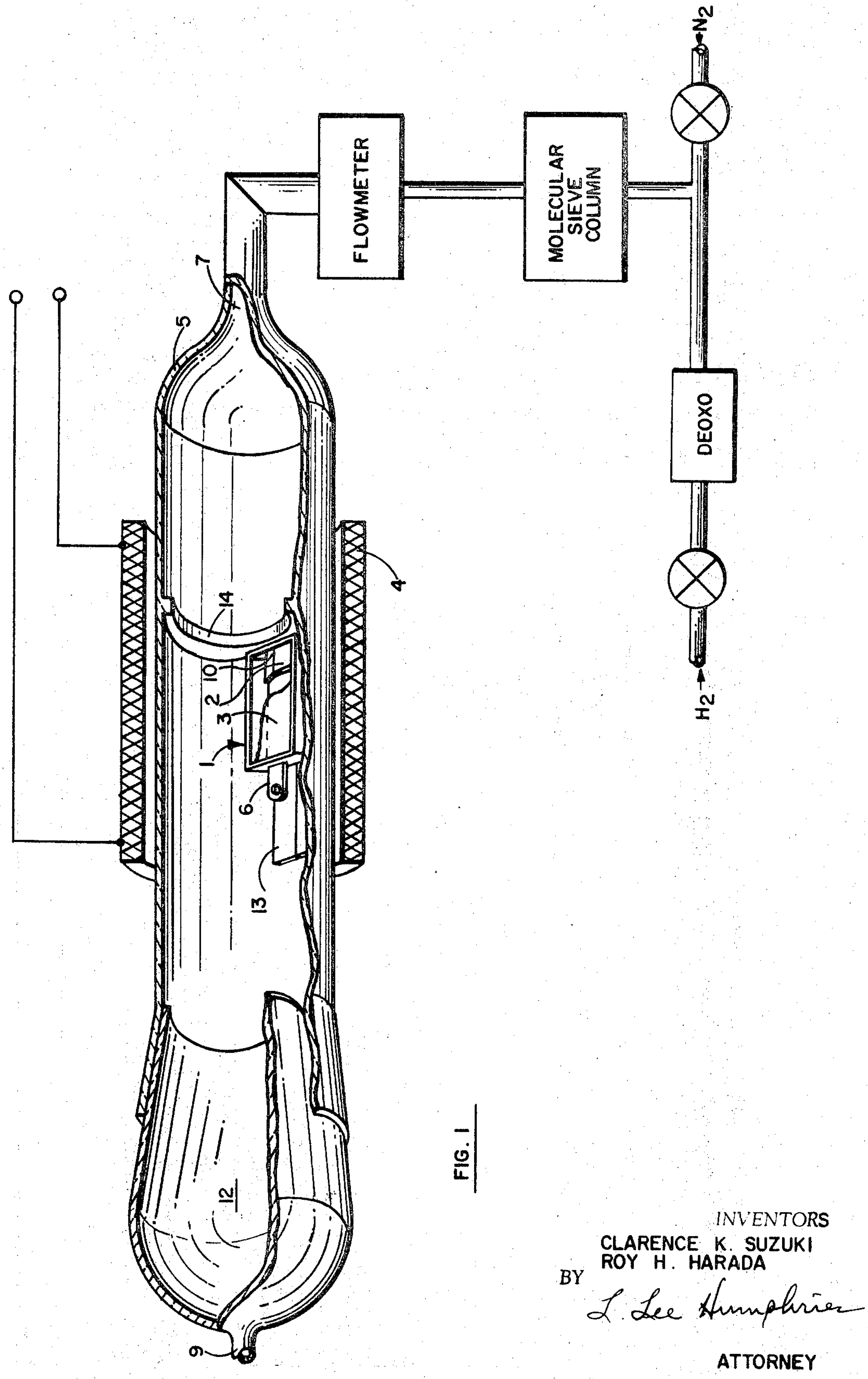

This invention relates to a process for growing germanium on gallium arsenide and more specifically to a process for epitaxially growing germanium on gallium arsenide from a saturated solution of Ge in Ga.

The combination of epitaxial germanium films on a gallium arsenide substrate has been recognized as offering numerous advantages in the semiconductor device field. For example, one important advantage derived from such a structure is the low contact resistance of the epitaxial interface which results in a more efficient transfer of heat away from the gallium arsenide substrate. In this manner heat build-up is reduced and increased power output in laser applications is achieved.

In addition, the Ge-GaAs heteroepitaxy has advantages in the fabrication of Fabry-Perot cavities. The structure is relatively easy to cleave compared to the difficulties encountered when attempting to cleave heteroepitaxy GaAs of molybdenum, tungsten, or sapphire. When germanium on gallium arsenide is cleaved, a clean parallel and flat surface results and there is no need to mechanically polish the surface. Such parallel, flat, cleaved surfaces are particularly useful in injection lasers.

Further, the combination of epitaxially deposited germanium on gallium arsenide also offers significant advantages when used as a photo-detector in the 0.9 to 2 micron range.

Gallium arsenide tunnel diodes can also be produced by using heavily doped N-type gallium arsenide substrates with heavily doped P-type germanium epitaxial growths. The resulting P-N junction is a hetero junction which may be used to produce other devices. Unlike the usual tunnel diodes which comprise a P-N junction using like semiconductor materials, for example, germanium-germanium or gallium arsenide-gallium arsenide, this device uses two unlike semiconductor materials.

Prior art methods for producing a germanium on gallium arsenide heteroepitaxy utilize vapor transport in either a closed tube or an open tube process and require that the substrate be maintained at a relatively high temperature in order to obtain the desired epitaxial growth. Applicants' process avoids many of the disadvantages of prior art processes, particularly the high temperature requirement, by providing a process in which a germanium layer is epitaxially deposited from a solution on a gallium arsenide substrate. The solution process of the present invention is simpler and more easily controllable, since growth is achieved at lower temperatures and faster precipitation from the solution is possible compared to the prior art vapor processes.

It is, therefore, the primary object of this invention to provide a solution process for growing germanium epitaxially on gallium arsenide.

Another object of this invention is to provide a process for epitaxially growing germanium on gallium arsenide relatively faster and at lower temperatures than is possible with certain presently used processes.

A further object of this invention is to provide a solution process for growing germanium epitaxially on gallium arsenide wherein the epitaxial films deposited have a smooth surface and uniform thickness.

It is a still further object of the present invention to provide a solution process for epitaxially depositing germanium on a gallium arsenide substrate in which the substrate surface is cleaned contemporaneously with the deposition.

Briefly, applicants' invention comprises the steps of placing a gallium arsenide substrate, together with a solution comprising gallium and germanium, in a controlled, heated environment. At a predetermined time and under controlled conditions, the gallium arsenide substrate is contacted with the solution, after which the temperature of the solution is reduced below the saturation level to epitaxially grow or deposit germanium on the gallium arsenide substrate. Subsequent to the growth, the substrate having the grown layer is removed from the solution.

Figure 3:
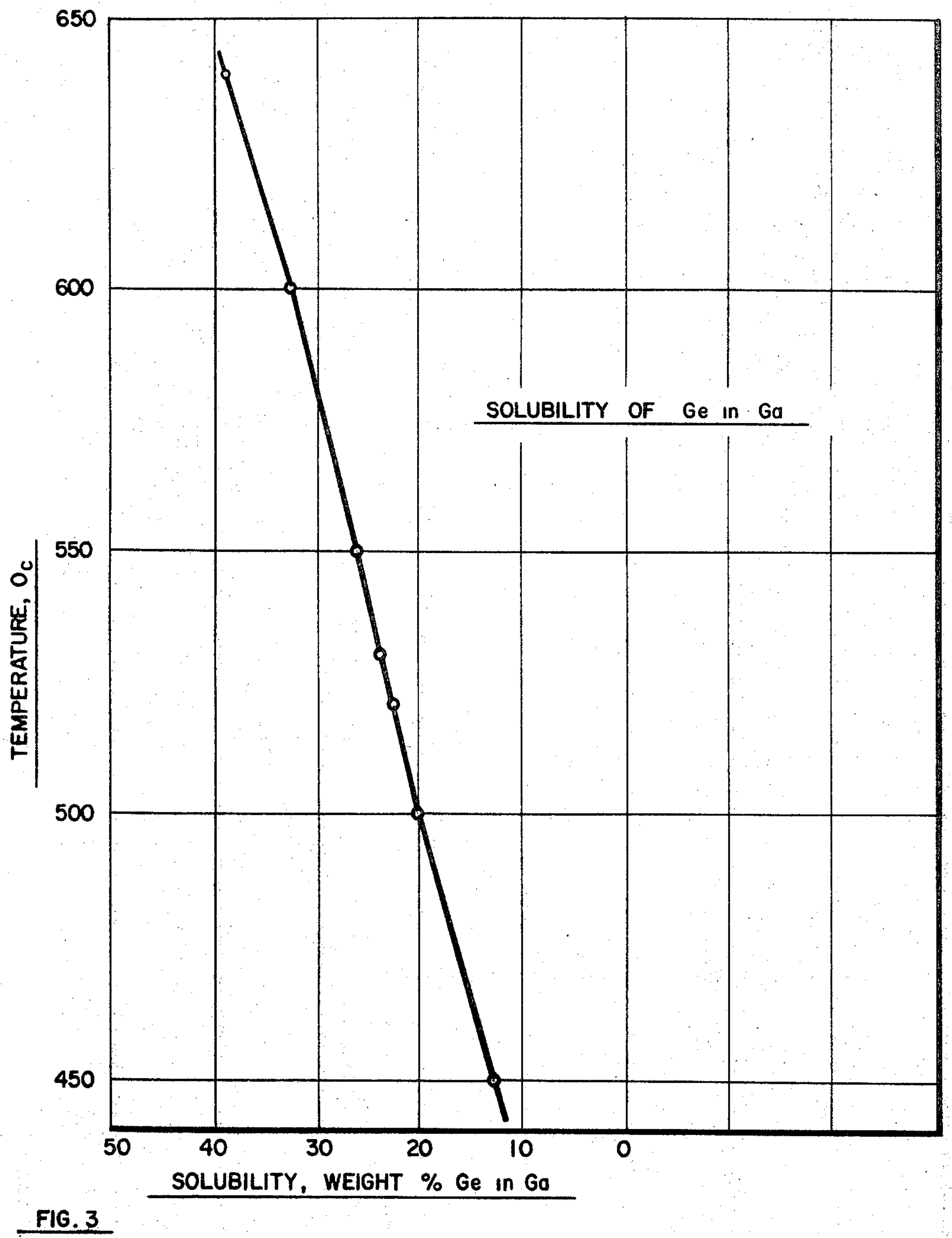
Figure 2:
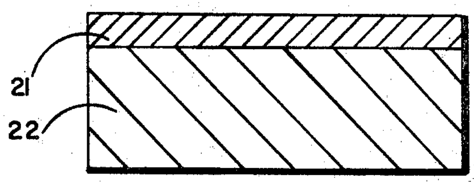

The invention and its objects and features will become apparent from the following description taken in light of the drawings in which:

FIG. 1 is a representation of a system for epitaxially growing germanium on gallium arsenide; and FIG. 2 is a cross-sectional view of a Ge epitaxial layer on a GaAs substrate; and FIG. 3 is a solubility curve of germanium and gallium over a temperature range.

Referring now to FIG. 1, apparatus for carrying out the process of this invention is illustrated and comprises container 1 suitably proportioned for enclosing substrate 2 and a gallium-germanium solution 3. The container is preferably graphite material but may be fabricated from other materials which are non-reactive to the gallium-germanium solution and which will withstand the temperatures at which germanium is grown on the substrate. Although in the embodiment shown only one substrate 2 is illustrated in the container 1, the container may be suitably proportioned to hold several substrates and a sufficient quantity of solution 3 to satisfy the requirements for growing germanium on a plurality of substrates.

In addition to the container, holding element 10, such as a graphite wedge or some similar material, is utilized in the container to hold the substrate 2 in place during the subsequent process steps.

The container may include a handle portion 6, such as a protruding section of material similar to the container, at one end of the container for selectively manipulating the container. For example, a quartz rod may be inserted into the hole shown in portion 6 for pushing and pulling the container.

Tube means 5, which constitutes an enclosure for container 1, may be a quartz tube or some similar temperature resistant and transparent material. The tube 5, at least at one circumferential area thereof, is enclosed by furnace means 4 for heating up container 1, and substrate 2 and solution 3 which are positioned therein. The furnace may be a wire-wound electrical furnace or, alternatively, a multi-turn R.F. coil, and is preferably of the tilt-type, such as described in RCA Engineer, 6, 20 (1960) in an article written by N. H. Ditrick and H. Nelson. The temperature is controlled by controlling the flow of current to the wires comprising the furnace. Control means and current source means are not shown in FIG. 1, but they may be assumed to be those standard in the art.

The tube means 5 for housing the container 1 is designed to provide for the injection of gases into tube means 5 through inlet 7 during the process. Outlet means 9 is also provided for the passage of gases and other elements from inside tube means 5. Means 12, such as a standard taper joint, is inserted into tube means 5 to form outlet means 9. Other standard laboratory items, a flow meter, valves, Deoxo, molecular sieve, are also shown in FIG. 1.

The container 1 is fabricated with sufficient mass so that once it is brought to operating temperature by the furnace, minor fluctuations in furnace temperature do not affect the substrate temperature. Thus, the container acts as a heat sink and temperature equilibrizer to prevent spurious temperature fluctuations at the substrate.

The container 1 is prevented from sliding longitudinally within tube means 5 by anchor plate means 13 and by protruding member means 14. The anchor plate 13 may be a fused quartz slab, and member 14 may be an integral protrusion on tube means 5.

The process of this invention is carried out utilizing the above-described or similar apparatus by performing certain operational steps on and with the substrate 2 and solution 3. The solution 3 is comprised of gallium and germanium with the gallium relatively pure, for example 99.999% pure, to reduce the doping effects caused by impurities other than gallium. In the event the gallium contains impurities, the germanium which is grown on the substrate may be contaminated, thereby adversely affecting the electrical characteristics of the final product.

The raw germanium may be either P-type or N-type and is present in the solution in sufficient quantity to saturate the gallium at the deposition temperature. Thus, the solution of gallium and germanium contains an excess of the germanium in order to insure complete saturation of the Ga at the particular deposition temperature.

It is preferred that the solution have approximately 23 weight percent germanium to 77 weight percent gallium at about 520° C. However, since the solubility of Ge in Ga depends upon the temperature (see Hansen, Constitution of Binary Alloys, p. 743, 2nd ed., McGraw-Hill, 1958), at 519° C. or less the ratio of 8:2.4 grams will provide excess germanium in the solution, while at a higher temperature that ratio might be insufficient to provide such excess. If there is no excess germanium in the gallium solution at a given operating temperature, there will be no Ge grown until the temperature is lowered to create an excess of Ge which then deposits out of solution on the substrate. Therefore, it is necessary to provide an initial solution composition which will have an excess of germanium at the operating temperature selected. In the preferred embodiment, excess germanium should be present in the solution in a range from about one to about five weight percent at the various operating temperatures.

FIG. 3 illustrates the solubility of germanium in gallium. As shown therein, in order to have an excess of germanium in the gallium solution for the ratio of 8 to 2 grams, a temperature of less than 500° C. must be selected. For example, if an initial temperature of 490° C. is selected, the solubility percent is approximately 18 percent at that temperature. Therefore, there is approximately a 2 percent excess germanium available for deposition onto a substrate if the temperature initially at 500° C. were to be lowered to 490° C.

If a different ratio, for example 7 to 3 is selected, the germanium is 30 percent soluble in gallium. In order to have an excess of germanium, an initial operating temperature of less than 580° C. must be selected. As will be explained subsequently, however, the ratio of germanuim and gallium as well as the initial temperature must be considered together.

In carrying out the process, container 1 is so placed within the effective area of the furnace 4 that a temperature differential is established between the substrate 2 and the solution 3. For example, the solution is heated to approximately 520° C., when the substrate is at 530° C., thereby establishing the required temperature differential. In this manner, when the container is tilted to cause an immersion of the substrate by the solution, the temperature differential will result in the solution being heated and the substrate being cooled upon initial contact. This arrangement makes unnecessary the need for external adjustment of temperature during the initial contacting of the solution and substrate. Because the solution automatically heats up in the above process, a small amount of the substrate is initially dissolved to produce a surface free from scratches, foreign elements, oxidation, etc. The magnitude of the temperature differential thus controls the amount of substrate initially dissolved. Thus, during the period required for temperature equilibrium to be attained after initial contact, there is no deposition of excess germanium present since precipitation will not take place during the time the temperature of the solution increases. However, a small incremental layer of the substrate surface will be dissolved during this period. Following this period, the temperature of both substrate and solution is lowered by external control such that the excess Ge begins to deposit out from the Ge-Ga solution onto the clean substrate GaAs surface.

If the solution temperature was maintained higher than the substrate temperature during initial contact, the solution temperature would be lowered and the solution would deposit Ge on the substrate immediately without the benefits of a clean surface so that non-uniform, rough growths would result.

On the other hand, if the solution temperature is too low, it would not dissolve much of the substrate during the short equilibrium or transient period after initial contact. Further, if the solution temperature equals the substrate temperature, there is a little more dissolution of the substrate (than when solution temperature is less than substrate temperature).

A preferred temperature differential between the solution and substrate is 10° C. with a preferred range being from 5° C. to 15° C.

Inasmuch as germanium is more soluble in Ga at high temperatures than at lower temperatures, there would be more Ge deposited at 530° C. than there would be at 630° C. Therefore, if the temperature at which initial contact is made is increased, it is necessary, as indicated above, to increase the ratio of germanium to gallium in solution in order to have an excess of germanium at the deposition temperature. As an example, at approximately 520° C., with a ratio of 2.4 grams Ge to 8 grams gallium, there is approximately a 0.5% excess of germanium in the solution. However, at 630° C. there would be no excess of germanium in the solution for the stated ratio.

It is preferred that the surface to volume ratio of substrate to solution be approximately four. This ratio may increase or decrease without materially affecting the process, providing there is enough solution to cover the substrate surface completely.

The substrate growth plane selected for use in the process should be nearly perpendicular to either a [111], [110] or [100] orientation, although [100] is the most preferred orientation for the most planar growths. The resulting heteroepitaxy of germanium on gallium arsenide can be cleaved without the necessity for polishing. The heterojunction of the germanium and gallium arsenide is essentially planar by this process.

The substrate may have various thicknesses within limits permitting good cleavage. For example, the substrate thickness may have a range of from 5 mils to 15 mils with a preferred thickness of about 10 mils. The diameter of a substrate may vary according to requirements and is typically ~¾".

After the appropriate substrate has been selected, properly cleaned and suitable solution and operating temperature selected, they are placed in container 1 which is positioned in tube means 5. The tube means 5 is then flushed with an inert gas. As shown in FIG. 1, a flushing gas, such as nitrogen, is injected through inlet 7, while the furnace is at room temperature. The flow rate of the purified nitrogen must be sufficiently great to prevent back diffusion of the ambient air into the furnace, and is preferably from 0.3 to about 1 liter per minute. The atmosphere or ambient inside tube means 5 may be changed by flushing with another gas, if desirable, such as purified hydrogen.

After the desired atmosphere has been changed from nitrogen to hydrogen in the tube means 5, the tube and contents are heated to operating temperature by the furnace. During this increase in temperature the solubility of germanium in the gallium changes, as noted above. If the selected solution is completely saturated at 530° C. the solution will be under-saturated at a higher temperature, i.e., about 535° C., and will be more than saturated at less than 530° C.

The solution temperature is preferably raised to 630° C. only to ensure complete saturation of the solution when the temperature is reduced to about 520° C. The temperature differential between solution and substrate is automatically obtained when temperature equilibrium occurs in 15–20 minutes at 520° C. The container 1 is then tilted to pour the gallium solution over the gallium arsenide substrate.

Under these conditions a small layer of the substrate is initially dissolved. After one minute of contact, the temperature of the substrate and solution is decreased by decreasing the power to the furnace for the purpose of initiating precipitation (deposition) of the germanium onto the gallium arsenide surface. During this growth period, the temperature is lowered at a predetermined rate sufficient to maintain deposition of the germanium onto the gallium arsenide surface. The speed at which the growth is desired is determined by the temperature reduction rate. The thickness and consistency of the epitaxial Ge layer is a function of the growth rate which is dependent on the temperature reduction rate.

For example, if the temperature is reduced from the temperature of approximately 522° C. to approximately 450° C. in fifteen minutes, an epitaxial growth layer of approximately 3 mils will result if there had been an excess of ~.5% Ge in the solution at 522° C. Whereas if the temperature reduction time is reduced to five minutes for the same temperature change, the growth layer will be closer to 10 mils of mostly polycrystalline growth. If a slower cooling rate were used, say, approximately 25 minutes, a growth layer of less than 3 mils may result. Thus, if the growth rate is too fast, the layer tends to be polycrystalline instead of single crystal or epitaxial. On the other hand, if the growth rate is too slow, the growth layer tends to be very thin. In this manner the particular growth rate expressed in terms of temperature reduction over a period of time with a selected solution, may be determined empirically. After the growth has been completed, the container is tilted back so that the substrate is no longer immersed by the solution.

The gas flowing through the tube to carry away foreign elements created during the process is changed from hydrogen to an inert gas such as nitrogen after which the substrate is removed.

The resulting germanium epitaxial layer may be either P-type or N-type material depending on whether the Ge solution is further doped with a donor for Ge. If the substrate is N-type gallium arsenide, a P-N heterojunction of germanium-gallium arsenide will result with only Ga dopant in Ge. If a P-type gallium arsenide substrate is used, then a P-P heterojunction results. If an additional donor for Ge is added to the Ga solution in sufficient amount to cause $N_D > N_A$, by compensation of the Ga, the N-type Ge N-type GaAs, and N-type GaAs heterojunctions also result.

The following examples are illustrative of the process of this invention.

EXAMPLE I

The general process steps outlined previously were followed and the structure described in connection with FIG. 1 was used in this example.

The gallium solution is comprised of 8 grams of 99.999% gallium and 2.4 grams of high-resistivity germanium. Experiments were conducted using either N-type or P-type germanium although for this experiment a P-type is used.

A substrate comprised of gallium arsenide and having a thickness of approximately 10 mils and being approximately ¾ of an inch in diameter with [100] orientation is placed in one end of a rectangular shaped graphite container. The ingredients of the solution, Ga and Ge, are placed in the opposite end of the container. After both the solution and the substrate are placed in the container and the substrate has been wedged in, the container is placed inside the tube in a tilted position such that the solution would not contact the substrate.

The tube is flushed with nitrogen to remove air and the tube ambient is changed to hydrogen at a flow rate of approximately 0.7 liter per minute. The furnace is brought to a temperature of 640° C. at the substrate to insure complete dissolution of Ge in Ga.

The temperature at the substrate is then reduced to 530° C. and maintained at that level for approximately 15 to 20 minutes to insure that the solution which is about 10° C. cooler (~520° C.) than the substrate contains an excess (22.5%) of Ge.

The substrate is next immersed in the gallium solution by tilting the container. After immersion, the temperature is allowed to equilibrate for approximately one minute. During this period of time, a thin layer of the substrate surface is dissolved and a smooth, clean surface is exposed for subsequent growth.

After the initial one-minute immersion, the temperature of the solution is lowered at a selected rate. For the first five minutes the temperature is lowered at a rate of 6.4° C. per minute. After the first five minutes the temperature is lowered at a rate of 4.8° C. for approximately 10 minutes until the temperature of approximately 450° C. is reached. During the time the solution is cooling in this controlled manner, the germanium is depositing epitaxially on the substrate. The furnace is then tilted back to the start position at 450° C. An epitaxial growth layer of approximately 3 mils resulted.

After the growth is complete, the ambient is changed from hydrogen to nitrogen to prevent an explosion. The substrate is wiped substantially clean of excess gallium solution with tissue paper and afterwards the substrate is immersed in concentrated hydrochloric acid until the additional traces of gallium solution are removed. The substrate is immersed in the acid until all bubbling has ceased and for a period thereafter totalling approximately two hours.

The resulting germanium epitaxial growth was of the p+ conductivity type.

Epitaxial growth was confirmed by means of X-ray analysis and by metallurgical sectioning.

EXAMPLE II

An experiment similar to the one discussed in Example I was conducted using a substrate having [111] orientation. Somewhat different results as indicated above were achieved, namely that large [111] growth pyramids resulted so that the surface was undulating with hills and valleys. Thicknesses were greater than with [100] oriented substrates with more than 2 mils of the top surface very nearly polycrystalline (usually lapped off).

EXAMPLE III

An experiment similar to the one discussed in Example I was conducted using a substrate having [110] orientation. Growth and quality of epitaxy obtained was approximately intermediate between [100] and [111].

A cross-sectional view of a germanium epitaxial layer on a GaAs substrate produced in accordance with the present invention is shown in FIG. 2. Approximately a 2 mil epitaxial layer 21 of germanium is shown on a GaAs substrate 22 of approximately 8 mils thickness.

In the preceding examples, the temperature of 520° C. for the gallium solution was used so that only a selected thickness of the gallium arsenide substrate was dissolved by the gallium solution. The solubility of gallium arsenide in gallium at 520° C. is approximately 1 weight percent. As indicated previously, the gallium solution includes germanium. The solution at 520° C. as seen in FIG. 3 is saturated with germanium to the extent of 22.5 percent. However, the dissolved gallium arsenide has a 1 percent solubility in gallium at 520° C. which increases slightly above 1 percent at higher temperatures. Therefore, when the gallium solution contacts the gallium arsenide substrate at 530° C. the temperature of the solution is slightly increased and the solubility is slightly more than 1 percent.

In the examples, if the solution temperature had been raised initially to 540° C. then the solubility of germanium in the gallium solution as indicated in FIG. 3 would be increased to about 25 percent and the solubility of gallium arsenide in the gallium solution would also be increased to approximately 2 percent. Also, if the temperature is reduced to 500° C., solubility of germanium and likewise gallium arsenide in the gallium decreases to about 20 percent and 0.5 percent, respectively. It is preferred that a stating temperature be selected so that the solution is near saturation or completely saturated with germanium. With regard to the gallium arsenide substrate, a temperature is selected so that only a desired thickness of the substrate is dissolved. As the temperature increases, more of the substrate is dissolved. If the temperature of the gallium solution is too high, the substrate is completely dissolved despite the saturated condition of the gallium solution with respect to germanium. If the temperature of the gallium solution is too low, little or none of the gallium arsenide substrate dissolves and a fresh clean surface is not exposed for the subsequent epitaxial growth of germanium on gallium arsenide so that a poor single crystal growth or polycrystalline growth would result.

In the practice of the process, the temperature-solubility relationship may be varied. In the examples, the furnace was initially heated to 640° C. in order to insure solubility of germanium in the gallium solution so that when the temperature of the gallium solution was reduced to 520° C. and maintained for 15 to 20 minutes, the gallium solution is saturated with germanium. Thus, at 520° C. there was excess germanium available for epitaxial growth as the temperature was reduced. While it is possible to continue the growth process until the freezing point of gallium is reached, the process was halted at a preselected temperature so that single crystal epitaxial growth was achieved without polycrystalline growth. The stop temperature was selected at approximately 450° C. although other temperatures lower or slightly higher, depending on the initial temperature, may also have been used.

The cooling rate selected was approximately 6.4° C. per minute for the first five minutes and approximately 4.8° C. per minute at the end of approximately 14 minutes. The cooling rate affects the amount of germanium that precipitates out of the gallium solution and affects the nature of the epitaxial growth. If the cooling rate is slow, less germanium precipitates from the saturated solution per minute, and if the rate is fast, more germanium precipitates out. In deciding on a growth rate, one may be selected which is in between the fastest and slowest rates, although if desired any particular rate may be selected within the limits defined herein. For the rates selected and described herein, the growth was seen to be a good quality epitaxial growth.

For a faster cooling rate such as 15° C. per minute, the quality of the growth was found to be less satisfactory, although the time for the process is reduced by one half.

The cooling rate may also be defined as the growth rate because as the solution cools down from the selected starting temperature of 520° C. to the first reduction of 513.6° C. in the first minute, the portion of the germanium which is soluble in the gallium solution at 520° C. but not soluble at 513.6° C. precipitates out of the solution onto the substrate, although only a small fraction of the precipitated germanium actually deposits on the substrate.

As stated in the examples, prior to immersing the gallium arsenide substrate in the gallium solution, the solution is at 520° C. and the substrate is at 530° C. When the substrate is immersed in the solution, the solution temperature rises towards 530° C. During approximately one minute following the time of immersion, it is estimated that the solution temperature increases to approximately 523° C. During this one minute interval, a portion of the gallium arsenide substrate is dissolved. Inasmuch as the temperature increases from 520° C. to approximately 523° C., it is necessary to provide excess germanium in the gallium solution. For the ratios used in the examples, 2.4 grams germanium to 10 grams gallium, the solution would remain saturated or slightly over-saturated at 523° C., thereby providing sufficient germanium in the solution for deposition upon reduction of the temperature. Since the gallium arsenide substrate dissolves, additional gallium becomes part of the solution but is of no consequence when compared to the bulk of the solution and may therefore be neglected.

In the examples, a cooling rate of 6.4° C. per minute was selected. The temperature of the substrate was lowered from the 530° C. initial temperature at the rate of 6.4° C. The substrate was cooled for five minutes at the 6.4° C. rate. After the first five minutes, the cooling rate is reduced progressively from 6.4° C. per minute to 4.8° C. per minute at the end of 14 minutes.

During the growth interval or controlled cooling period, the amount of germanium in the solution decreases due to the precipitation of germanium out of solution. The quantity of germanium actually growing or depositing on the gallium arsenide substrate is a function of the cooling rate and the solubility of germanium in gallium at a particular temperature. It should be noted that the bulk of the germanium which precipitates out of solution floats in solution with only a small fraction growing epitaxially on the GaAs substrate.

Table I shows the solubility of germanium in gallium at one minute intervals of the cooling cycle. The weight ratio of 8:2.4 is assumed.

TABLE I

| | Solution Temperature, ° C. | Solubility of Germanium in Gallium, weight percent |
|---|---|---|
| Time, cool rate 6.4° C. per minute: | | |
| 0 | 523 | 22.9 |
| 1 | 516.6 | 22 |
| 2 | 510.2 | 21.3 |
| 3 | 503.6 | 20.4 |
| 4 | 497 | 19.5 |
| 5 | 490.4 | 18.5 |

Table II shows the amount of germanium precipitating out of the solution at each temperature interval.

TABLE II

| | Solution Temperature, ° C. | Precipitated Germanium, grams |
|---|---|---|
| Time, minutes: | | |
| 0 | 523 | |
| 1 | 516.6 | .09 |
| 2 | 510.2 | 0.09 |
| 3 | 503.6 | .08 |
| 4 | 497 | .10 |
| 5 | 490.4 | .15 |

By the time the temperature of the solution reaches 450° C. approximately 1 gram of the germanium has precipitated out of the solution so that approximately 1.4 grams remains in solution.

In other examples it has been observed that if the cooling rate is doubled during the first five minutes from 6.4 to approximately 130 C. per minute and the initial temperature of the solution is approximately 523° C. during the first minute, then the solution temperature would be reduced to 510° C. as shown in Table III.

TABLE III

| | Solution temperature, ° C. | Germanium Precipitation, grams |
|---|---|---|
| Time, minutes: | | |
| 0 | 523 | |
| 1 | 510 | .18 |
| 2 | 497 | .19 |
| 3 | 484 | .19 |
| 4 | 471 | .15 |
| 5 | 458 | .21 |

As is apparent from a comparison of Tables II and III, the amount of germanium precipitating out of the solution increases as the cooling rate increases. As the precipitation increases, the growth tends to decrease in quality.

In a subsequent example, a ratio of 8 grams gallium to 2 grams germanium in solution was used. The amount of precipitation is shown in Table IV.

TABLE IV

| | Solution Temperature, ° C. | Precipitation Out, grams |
|---|---|---|
| Time, cool rate at 6.4° C. per minute: | | |
| 0 | 523 | |
| 1 | 516.6 | 0 |
| 2 | 510.2 | 0 |
| 3 | 503.6 | 0 |
| 4 | 497 | .05 |
| 5 | 490.4 | .15 |

As indicated in Table IV, whenever the amount of germanium in solution is insufficient to provide an excess of germanium at the particular temperature, there is no germanium deposition or precipitation out of the solution onto the substrate. The deposition occurs only after the temperature is reduced until there is excess germanium in the solution.

Using the doubled cool rate of 13° C. for a weight ratio of 8:2, the following results, shown in Table V, are obtained. A much greater precipitation results.

TABLE V

| | Solution Temperature, ° C. | Precipitation Out, grams |
|---|---|---|
| Time, cool rate at 13° C. per minute: | | |
| 0 | 523 | |
| 1 | 510 | 0 |
| 2 | 497 | .05 |
| 3 | 484 | 0.17 |
| 4 | 471 | 0.17 |
| 5 | 458 | 0.2 |

In the examples shown, the 520° C. temperature for the solution was selected so that very little of the gallium arsenide substrate dissolved during the initial minute when the substrate was immersed in the solution. As the temperature increases, the solubility of gallium arsenide in gallium increases from approximately one percent at 520° C. to approximately ten percent at 630° C. As a result, approximately one half of a substrate would be dissolved if the initial temperature of 630° C. was used. The amount of the substrate which dissolves does not materially affect the process, however, if sufficiently thick substrates are used to compensate for the extra dissolution. At 630° C. the quantity of germanium sufficient to maintain a saturated solution of germanium and gallium would increase, for example, to 3.5 grams of germanium for 8 grams of gallium. A lower temperature may be selected, such as 500° C., but the epitaxial layer would have a poorer quality at a lower initial temperature.

Also, in the examples shown, the end of the cooling cycle or growth cycle used was 450° C. as the lower temperature. Other lower temperatures may also be used but it was found that the growth tends to become polycrystalline at less than 450° C. In the examples of the process, the growth may vary from as little as 2 microns to 3 or more mils in thickness. At the greater thickness, however, as stated above the growth tends to become polycrystalline and it may be necessary to polish or lap the surface of the layer until a single crystal region is achieved. Lapping may reduce the epitaxial layer to a thickness of approximately 3 mils or less after removal of the polycrystalline region.

The following examples show some of the variations in temperature for various thicknesses of substrates. The general process steps and apparatus used in connection with Example I were used in the following example.

EXAMPLE IV

With a starting temperature of 630° C., at which the solubility of Ge in Ga is 36.8%, and with a final temperature of 530° C., at which the solubility is 23.8%, 13 percent by weight germanium precipitated out of the solution. The substrate was approximately 30 mils in thickness and approximately 15 mils dissolved. The resulting epitaxial growth showed a germanium epitaxial layer heavily doped with gallium.

EXAMPLE V

With a starting temperature of 520° C., at which the solubility of Ge in Ga is 22.5%, and with a final temperature of 450° C., at which the solubility of Ge in Ga is 13%, 9.5 percent by weight germanium precipitated out of the solution. The substrate was approximately 10 mils in thickness and approximately 0.1 mil dissolved. The germanium epitaxial layer was also heavily doped with gallium.

EXAMPLE VI

With a starting temperature of 575° C., at which the solubility of Ge in Ga is 29.4%, and with a final temperature of 500° C., at which the solubility of Ge in Ga is 20%, 9.4 percent germanium precipitated out. The gallium arsenide substrate was approximately 20 mils thick and approximately 5 mils of the substrate dissolved. The germanium epitaxial layer was heavily doped with gallium.

If the starting temperature is increased to 630° C., the process can tolerate higher cooling rates; because of the higher temperatures the epitaxial growth has a better quality. If the starting temperature is low, for example, 500° C., the cooling rate must be as small as possible, such as 2 to 5° C. per minute because the epitaxial growth would be poorer at lower temperatures.

The preferred temperature interval is from approximately 520° C. to approximately 450° C. for the solution temperature with a cooling rate of 6.4° C. for the first five minutes.

It should be understood that the invention is intended to cover all changes and modifications of the examples of the process herein described in the specification which do not constitute departure from the spirit and scope of the invention as defined in the appended claims.

We claim:

1. A process for heteroepitaxially depositing a semiconductive element contained in a liquid comprising germanium in gallium on a solid binary substrate, wherein said element is germanium and said substrate is gallium arsenide, comprising the steps of:

heating said liquid and substrate;

contacting said heated substrate and said heated liquid containing said element said liquid and said substrate having an initial temperature differential; and reducing the temperature of said liquid and said substrate below the saturation level of said germanium in gallium so that an excess of germanium in said liquid is deposited heteroepitaxially on the gallium arsenide substrate, thereby providing an essentially planar junction of the semiconductor with the substrate.

2. A process for heteroepitaxially depositing a semiconductor material of germanium on a gallium arsenide substrate comprising the steps of:

heating said gallium arsenide substrate to a first temperature;

heating a solution comprising gallium and said semiconductor material to a second temperature, said solution having an excess of said semiconductor material of at least about 0.5 percent at said second temperature, said second temperature being lower than said first temperature;

initially contacting said substrate and said solution in a controlled atmosphere, said step of initially contacting causing a decrease in the temperature of said substrate and an increase in the temperature of said solution to an equilibrium temperature so that during the time required to reach equilibrium an incremental portion of the substrate surface contacted by said solution is dissolved; and reducing said equilibrium temperature of said solution and said substrate and maintaining contact of the solution with the substrate for a time sufficient to permit an excess of said germanium to deposit heteroepitaxially on said surface of said substrate, thereby providing an essentially planar junction of the semiconductor with the substrate.

3. The process of claim 2 in which the difference between said first and second temperature is from about 5° to about 15° C.

4. A process for heteroepitaxially depositing a semiconductor element contained in a solution on to a solid binary substrate of gallium arsenide comprising the steps of:

isolating the substrate from the element in the solution, the solution being comprised of gallium and germanium;

heating said substrate to a first temperature level;

heating said solution to a second temperature level less than said first temperature level, said solution being liquid and having an excess of the element at said second temperature level;

imersing said substrate in said solution so that a predetermined thickness of said substrate is dissolved by said solution; and maintaining the step of immersing while selectively reducing the temperature at a rate sufficient to promote precipitation of excess element material from the solution and produce heteroepitaxial deposition thereof of a predetermined thickness on the substrate, thereby providing an essentially planar junction of the semiconductor with the substrate.

5. A process for heteroepitaxially depositing a single element in a liquid solution on a binary substrate comprising the steps of:

heating the liquid solution consisting essentially of germanium and gallium in which an excess of germanium is present;

heating a gallium arsenide substrate in the same environment as the solution to a temperature higher than the temperature of said solution;

contacting said heated liquid solution with said heated substrate so that for a predetermined period the solution is heated and the substrate is cooled by the act of contacting and an incremental thickness of the surface of said substrate is removed before equilibrium temperature is attained;

lowering the temperature of the solution to maintain an excess of germanium therein, said germanium depositing heteroepitaxially on said substrate, thereby providing an essentially planar junction of the semiconductor with the substrate; and removing said substrate from said solution and cleaning said substrate and said deposited germanium.

6. The process of claim 5 wherein the initial difference between said solution temperature and said substrate temperature is from about 5° C. to about 15° C.

7. The process of claim 5 wherein said equilibrium period is about one minute and the initial difference between said solution and substrate temperatures is about 10° C.

8. The process as recited in claim 5 wherein said solution and said substrate are placed in a container prior to the step of heating the liquid solution, said container being tilted to initially prevent contact between said solution and said substrate, and wherein said gallium is 99.999 percent pure gallium, said gallium arsenide substrate and said germanium being of a preselected conductivity type.

9. The process as recited in claim 5 wherein said solution contains at least about 20 weight percent germanium and said gallium is 99.999 percent pure gallium.

10. The process as recited in claim 5 wherein said gallium arsenide substrate has [100] orientation and wherein said gallium is 99.999 percent pure, said germanium comprising at least about 20 weight percent of said solution.

11. The process as recited in claim 5 wherein said gallium arsenide substrate has [110] orientation and wherein said gallium is 99.999 percent pure, said germanium comprising at least about 20 weight percent of said solution.

12. The process as recited in claim 5 wherein said germanium arsenide substrate has [111] orientation and wherein said gallium is 99.999 percent pure, said germanium comprising at least about 20 weight percent of said solution.

13. The process as recited in claim 5 wherein said substrate is at a temperature of approximately 530° C. and said solution is at a temperature of about 520° C. prior to said contacting.

14. A process for heteroepitaxially depositing a semiconductor element of germanium on a single crystal substrate of gallium arsenide, comprising the steps of:
providing remote from said substrate a heated liquid solution of $x\%$ of said semiconductor element and $(100-x)\%$ gallium, said solution having a first temperature at which approximately $x\%$ of said semiconductor element is just soluble in said gallium;
immersing said substrate in said solution, and reducing said substrate and said solution to a second temperature at which $y\%$ of said semiconductor element is soluble in said gallium, the value of $y$ being between 0.5% and 5% less than the value of $x$, thereby causing the excess semiconductor element in said solution to be deposited heteroepitaxially on said substrate thereby providing an essentially planar junction of the semiconductor with the substrate; and
removing said substrate from said solution.

References Cited

UNITED STATES PATENTS

| | | | |
|---|---|---|---|
| 3,351,502 | 11/1967 | Rediker | 148—177 |
| 3,411,946 | 11/1968 | Tramposch | 148—116 XR |
| 2,813,048 | 11/1957 | Pfann | 148—1.5 |
| 3,057,762 | 10/1962 | Gans | 148—33.4 |
| 3,290,188 | 12/1966 | Ross | 148—177 |

OTHER REFERENCES

Nelson, H.: RCA Review, December 1963, pp. 603–615.

RICHARD O. DEAN, Primary Examiner

U.S. Cl. X.R.

23—301; 117—200, 201; 148—1.6, 33.4, 171, 172